(12) United States Patent
Jeong et al.

(10) Patent No.: US 11,508,937 B2
(45) Date of Patent: Nov. 22, 2022

(54) LIGHT-DIFFUSING BARRIER FILM

(71) Applicant: LG CHEM, LTD., Seoul (KR)

(72) Inventors: Hee Joon Jeong, Daejeon (KR); Jang Yeon Hwang, Daejeon (KR); Bo Ra Park, Daejeon (KR); Sung Jin Shin, Daejeon (KR); Hee Wang Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 25 days.

(21) Appl. No.: 17/047,508

(22) PCT Filed: Apr. 17, 2019

(86) PCT No.: PCT/KR2019/004619
§ 371 (c)(1),
(2) Date: Oct. 14, 2020

(87) PCT Pub. No.: WO2019/203558
PCT Pub. Date: Oct. 24, 2019

(65) Prior Publication Data
US 2021/0119179 A1    Apr. 22, 2021

(30) Foreign Application Priority Data

Apr. 17, 2018  (KR) .................. 10-2018-0044337
Apr. 17, 2019  (KR) .................. 10-2019-0044610

(51) Int. Cl.
*H01L 51/50*     (2006.01)
*H01L 51/52*     (2006.01)
(Continued)

(52) U.S. Cl.
CPC ........ *H01L 51/5253* (2013.01); *C09D 133/14* (2013.01); *C09D 183/16* (2013.01);
(Continued)

(58) Field of Classification Search
CPC .......... B23B 2307/40; B23B 2307/238; G02B 5/0221; G02B 5/0226; H01L 2251/558;
(Continued)

(56) References Cited

U.S. PATENT DOCUMENTS 10,654,070 B2    5/2020  Yang et al.
2007/0260035 A1* 11/2007  Watanabe ............ H05K 1/0346
                                              528/353
(Continued)

FOREIGN PATENT DOCUMENTS

CN    104570173 A    4/2015
CN    105793644 A    7/2016
(Continued)

OTHER PUBLICATIONS

Extended Search Report of European Patent Office in Appl'n No. 19787799.6, dated Aug. 11, 2021.
(Continued)

*Primary Examiner* — Caridad Everhart
(74) *Attorney, Agent, or Firm* — Dentons US LLP

(57) ABSTRACT

Provided is a light-diffusing barrier film. The film is an integral film comprising a barrier layer, a base layer and a light-diffusing layer, sequentially. The film can prevent moisture penetration into a device such as an organic light emitting device, and also imparts a light-diffusing function to the device. In particular, the film can have excellent moisture blocking properties even after a roll-to-roll process.

17 Claims, 1 Drawing Sheet

(51) Int. Cl.
  *C09D 133/14* (2006.01)
  *C09D 183/16* (2006.01)
  *H01L 51/56* (2006.01)
  *C08K 5/00* (2006.01)

(52) U.S. Cl.
  CPC .......... *H01L 51/5268* (2013.01); *H01L 51/56* (2013.01); *C08K 5/0075* (2013.01); *H01L 2251/558* (2013.01)

(58) Field of Classification Search
  CPC .. H01L 51/5268; H01L 51/558; C09D 133/14
  See application file for complete search history.

(56) References Cited

U.S. PATENT DOCUMENTS

| | | | |
|---|---|---|---|
| 2010/0072884 A1* | 3/2010 | Tchakarov | B32B 17/10788 445/35 |
| 2014/0141218 A1 | 5/2014 | Yoshihara et al. | |
| 2014/0151656 A1* | 6/2014 | Zeng | H01L 51/0096 428/411.1 |
| 2015/0301257 A1 | 10/2015 | Choi et al. | |
| 2016/0327719 A1 | 11/2016 | Kitahara et al. | |
| 2017/0107344 A1* | 4/2017 | Iwaya | B05D 7/04 |
| 2017/0222183 A1 | 8/2017 | Cho et al. | |
| 2019/0032208 A1 | 1/2019 | Takashima | |

FOREIGN PATENT DOCUMENTS

| | | |
|---|---|---|
| CN | 106457755 A | 2/2017 |
| EP | 3127696 A1 | 2/2017 |
| JP | H09-113708 | 5/1997 |
| JP | 2003326651 A | 11/2003 |
| JP | 2011110916 A | 6/2011 |
| JP | 2011-251460 | 12/2011 |
| JP | 2013-071390 | 4/2013 |
| JP | 2014162550 A | 9/2014 |
| JP | 2015505074 A | 2/2015 |
| JP | 2016147967 A | 8/2016 |
| JP | 2016-155352 | 9/2016 |
| JP | 2017-040730 | 2/2017 |
| JP | 2017-040834 | 2/2017 |
| JP | 2017107174 A | 6/2017 |
| JP | 2017-124633 | 7/2017 |
| JP | 2017-209834 | 11/2017 |
| KR | 10-2008-0057945 | 6/2008 |
| KR | 10-2010-0018695 | 2/2010 |
| KR | 10-2013-0129740 | 11/2013 |
| KR | 10-2015-0112892 | 10/2015 |
| KR | 1020160102605 A | 8/2016 |
| KR | 10-2017-0113451 | 10/2017 |
| KR | 1020170113444 A | 10/2017 |
| WO | 2015152077 A | 10/2015 |
| WO | 2015190202 A1 | 12/2015 |
| WO | 2017-171489 | 10/2017 |

OTHER PUBLICATIONS

Office Action of Japanese Patent Office in Appl'n No. 2020-557236, dated Oct. 25, 2021.
Office Action of Chinese Patent Office in Appl'n No. 201980026031.5, dated Nov. 22, 2021.
Office Action of Japanese Patent Office in Appl'n No. 2020-557236, dated May 30, 2022.

* cited by examiner

[Figure 1]
[Figure 2]
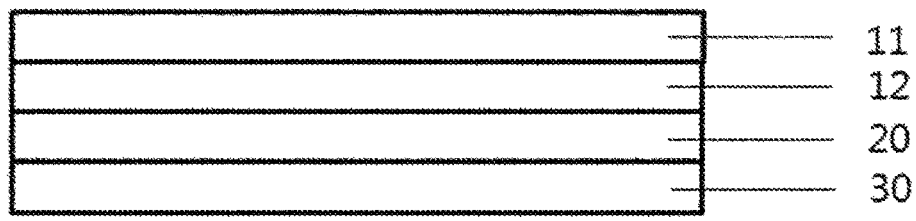
[Figure 3]
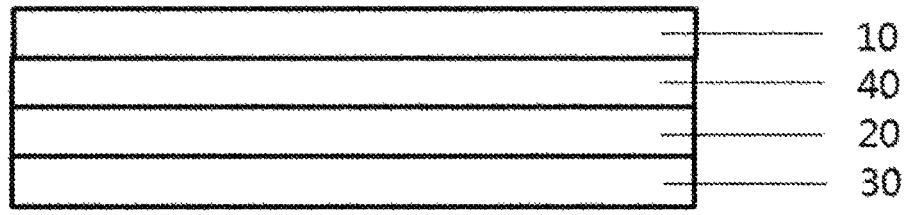
[Figure 4]
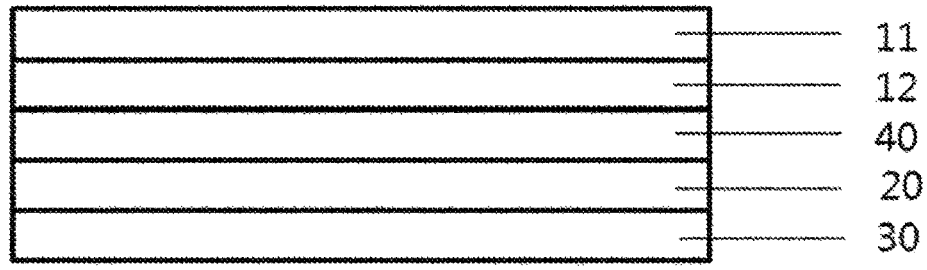

LIGHT-DIFFUSING BARRIER FILM

CROSS-REFERENCE TO RELATED APPLICATIONS

This application is a National Stage Application of International Application No. PCT/KR2019/004619 filed on Apr. 17, 2019, which claims the benefit of priority based on Korean Patent Application No. 10-2018-0044337 filed on Apr. 17, 2018 and Korean Patent Application No. 10-2019-0044610 filed on Apr. 17, 2019, the disclosures of which are incorporated herein by reference in their entirety.

TECHNICAL FIELD

The present application relates to a light-diffusive barrier film and a method for manufacturing the same. Specifically, the present application relates to an integral film comprising a barrier layer and a light-diffusing layer simultaneously, and a manufacturing method thereof using a roll-to-roll process.

BACKGROUND ART

A device including an organic light-emitting material or a light source such as a backlight unit has a problem that durability is lowered when exposed to moisture or oxygen. Thus, a barrier film can be used for such a device in order to protect the device from the external environment. In order to uniformly diffuse the light projected from the light source, a light-diffusing sheet is also required. When both the light diffusion function and the barrier property are required, it can be considered to use the barrier film and the light-diffusing sheet by attaching them using an adhesive.

The film or sheet can be produced using dry coating or wet coating. For example, when the imparting of the blocking property to the film is mainly performed by an inorganic material such as a metal, the barrier film can be produced by dry coating such as a physical vapor deposition method (PVD) or a chemical vapor deposition method (CVD). Then, when the imparting of the blocking property to the film is mainly performed by an organic/inorganic composite material, the barrier film can be produced by wet coating.

On the other hand, it is required that the barrier film for display also be manufactured in a large area in accordance with the tendency of the enlargement in the display area. When the barrier film is produced by a dry coating method such as vapor deposition, it has an advantage of being excellent in thin film uniformity as compared to the wet coating, but it is expensive, and it is not easy to increase the area. In addition, the dry and wet coating can be performed during a roll-to-roll process, where during the roll-to-roll process the barrier material can be damaged, while significant pressure is applied in a process of winding or unwinding a film to be transferred onto the roll, and as a result, the barrier property of the film can deteriorate.

Therefore, there is a need for a technique for providing a barrier film that does not deteriorate the barrier property in the manufacturing process, has a light-diffusing property, and is capable of being mass-produced even in a large area.

DISCLOSURE

Technical Problem

It is one object of the present application to provide an integral film having excellent blocking properties against an external environment (e.g., moisture) and simultaneously having a light diffusion function, that is, a light-diffusive barrier film.

It is another object of the present application to provide a large-area light-diffusive barrier film.

It is another object of the present application to provide an electronic or electrical device comprising the film.

It is another object of the present application to prevent, upon production of a barrier film using a roll-to-roll process, the barrier film from being damaged.

It is another object of the present application to produce a light-diffusive barrier film according to a wet coating method so that no separate adhesive layer is require, thereby making the barrier film thin and simplifying the manufacturing process.

The above and other objects of the present application can be all solved by the present application, which is described in detail below.

Technical Solution

In one example of the present application, the present application relates to a light-diffusive barrier film. That is, the present application relates to an integral film having a light diffusion function as well as a barrier property simultaneously.

The light-diffusive barrier film comprises a light-diffusing layer, a base layer and a barrier layer. Specifically, the film can comprise a light-diffusing layer and a barrier layer on both sides of a base layer facing each other, respectively. That is, as shown in FIG. 1, the barrier film can comprise a light-diffusing layer, a base layer and a barrier layer sequentially.

Unless otherwise specifically defined, the term "on" or "above" which is used in connection with interlayer lamination positions in the present application can be used in a sense to encompass not only a case where any configuration is located just above another configuration but also a case where a third configuration is interposed between these configurations.

The inventors of the present application have found that when a barrier film is produced using wet coating during a roll-to-roll process, there is damage to materials with barrier characteristics. For example, in the case of forming a barrier layer on a base layer, a laminate including the barrier layer can be subjected to a process of being wound on a roll or a roller or being unwound therefrom. Particularly, in the process that the wound film is unwound, a considerable amount of static electricity can be generated as the interface of the thin laminate film is separated, and the static electricity causes damage of the barrier layer. In order to reduce the generation of static electricity, it is necessary that the interface between the barrier layer and the base layer does not completely come in close contact with each other even if they have been wound. However, this is not easy considering the tension applied to the film upon winding it on the roll. On the other hand, in order to reduce the generation of static electricity, it is possible to consider forming irregularities on the surface of a certain layer so that the interface between the barrier layer and the base layer does not completely come in close contact with each other. However, the irregularities of the barrier layer itself can cause defects in thin film stability and barrier properties of the barrier layer. Furthermore, if the irregularities of the layer (for example, light-diffusing layer) in contact with the barrier layer in the wound state are too large, the barrier layer can be damaged by the tension applied at the time of winding.

In view of this point, the inventors of the present application have invented a light-diffusive barrier film suitable for a roll-to-roll process, without deteriorating the barrier layer properties. The light-diffusive barrier film of the present application improves the roll-to-roll process, while securing the light diffusion function by imparting predetermined irregularities to the light-diffusing layer, and simultaneously prevents the damage of the barrier layer.

In this connection, the light-diffusing layer of the present application has predetermined surface roughness (Rt) on one side thereof.

In this specification, the term "surface roughness (Rt)" means a distance between the highest point ($H_1$) and the lowest point ($H_2$), that is, a height difference ($\Delta H = H_1 - H_2$), when a layer, which is intended to measure the surface roughness, is observed in the direction normal to the surface. As described below, the light-diffusing layer can comprise a resin, which is a matrix component, and a particle component, where the highest point ($H_1$) observed upon measuring the surface roughness (Rt) can be a point formed by one particle or by aggregation of a plurality of particles, and the lowest point ($H_2$) can be a point formed by the resin or particle component. This surface roughness (Rt) can be measured using the equipment described in the examples.

Specifically, in the light-diffusive barrier film, a first side ($S_1$) opposite to a second side of the light-diffusing layer facing the base layer has irregularities having surface roughness (Rt) of 6 μm or less. The first side ($S_1$) of the light-diffusing layer having the irregularities contacts the barrier layer when it is wound on the roller. Therefore, through the irregularities, the degree of close contact between the light-diffusing layer and the barrier layer can be reduced, and damage of the barrier layer due to static electricity can be prevented.

In one example, the surface roughness (Rt) can be 0.01 μm or more, 0.02 μm or more, 0.03 μm or more, 0.04 μm or more, 0.05 μm or more, 0.06 μm or more, 0.07 μm or more, 0.08 μm or more, 0.09 μm or more, or 0.1 μm or more. Specifically, the surface roughness (Rt) can be 0.2 μm or more, 0.3 μm or more, 0.4 μm or more, 0.5 μm or more, 0.6 μm or more, 0.7 μm or more, 0.8 μm or more, 0.9 μm or more, or 1.0 μm or more, and can be, more specifically, 1 μm or more, 1.5 μm or more, 2.0 μm or more, 2.5 μm or more, 3.0 μm or more, 3.5 μm or more, 4.0 μm or more, 4.5 μm or more, or 5.0 μm or more.

When the surface roughness (Rt) exceeds 6 μm, one side of the barrier layer in contact with the first side ($S_1$) of the light-diffusing layer can be damaged by the irregularities.

Although not particularly limited, the lower limit of the surface roughness (Rt) can be 0.02 μm or more. When the lower limit of the surface roughness is smaller than the above lower limit, there is a high possibility that static electricity is generated at the time of unwinding the film wound on the roller.

In one example, the number of particles observed on the irregularity surface can be within a range of 0.8 to 3.0/μm². For example, the number of particles per unit area (μm²) observed on the irregularity surface can be 0.9/μm² or more, 1.0/μm² or more, 1.1/μm² or more, 1.2/μm² or more, 1.3/μm² or more, 1.4/μm² or more, 1.5/μm² or more, 1.6/μm² or more, 1.7/μm² or more, 1.8/μm² or more, 1.9/μm² or more, or 2.0/μm² or more, and can be 2.9/μm² or less, 2.8/μm² or less, 2.7/μm² or less, or 2.6/μm² or less. The number of the particles can be obtained by obtaining an SEM image having a magnification of ×50,000 with respect to a predetermined area (width μm×height μm) of the relevant layer and confirming the number of particles observed on the surface. In one example, identification of the number of particles can be made several times, for example three or five times, and the average value can be taken as the number of the particles.

In one example, the light-diffusing layer, the base layer, and the barrier layer can further comprise another layer between the adjacent layers.

In another example, the light-diffusing layer, the base layer, and the barrier layer can be in direct contact with the adjacent layers. Specifically, a separate adhesive may not be used between the adjacent layers. As a result, it is possible to provide a film, which is also thin, having excellent barrier properties.

In one example, the surface roughness (Rt) of the light-diffusing layer can be in a range of 0.1 to 6 μm. When the above range is satisfied, the possibility of generating static electricity at the time of unwinding the film is relatively low. Specifically, the light-diffusive barrier film comprises a light-diffusing layer; a base layer; and a barrier layer sequentially, where the first side ($S_1$) opposite to the second side of the light-diffusing layer facing the base layer can have irregularities with the surface roughness (Rt) in the range of 0.1 to 6 μm.

In one example, when the surface roughness (Rt) of the light-diffusing layer is less than 0.1 μm, for example, 0.01 μm or more and less than 0.1 μm, it can be configured so that the sheet resistance of the first side ($S_1$) of the light-diffusing layer with the surface roughness satisfies $10^{10}$ Ω/sq or less. Specifically, the light-diffusive barrier film comprises a light-diffusing layer; a base layer; and a barrier layer sequentially, where the surface roughness of the first side ($S_1$) opposite to the second side of the light-diffusing layer facing the base layer can be 0.02 μm or more and less than 0.1 μm, and the sheet resistance of the first side ($S_1$) of the light-diffusing layer with the surface roughness can be $10^{10}$ Ω/sq or less.

In this regard, in the case where irregularities exist on the first side ($S_1$) of the light-diffusing layer, the possibility of static electricity to be generated when peeling off the interface between the light-diffusing layer and the barrier layer can be lower than in the case where they do not exist, but if the surface roughness is 0.02 μm or more and less than 0.1 μm, it is necessary to adjust the sheet resistance of the first side ($S_1$) of the light-diffusing layer to a certain level. This makes it possible to prevent damage to the barrier layer due to static electricity, which is a concern at the time of unwinding the film, despite the relatively low surface irregularities.

In one example, the sheet resistance of the first side ($S_1$) of the light-diffusing layer having the surface roughness (Rt) of less than 0.1 μm can be $1.0 \times 10^{12}$ Ω/sq or less, $1.0 \times 10^{11}$ Ω/sq or less, $1.0 \times 10^{10}$ Ω/sq or less, $1.0 \times 10^{9}$ Ω/sq or less, or $1.0 \times 10^{8}$ Ω/sq or less. The sheet resistance value defines a size capable of preventing damage to the barrier layer due to static electricity in relation to the irregularities, where the lower limit thereof is not particularly limited. For example, the lower limit can be $1.0 \times 10^{7}$ Ω/sq or more, $1.0 \times 10^{8}$ Ω/sq or more, or $1.0 \times 10^{9}$ Ω/sq or more.

A means for satisfying the sheet resistance of the light-diffusing layer having surface roughness (Rt) of less than 0.1 μm within the above range is not particularly limited. For example, any light-diffusing layer formation material can be appropriately selected. In one example, the light-diffusing layer having surface roughness (Rt) of less than 0.1 μm can comprise a predetermined amount of an antistatic agent.

In one example, the light-diffusive barrier film can satisfy a water vapor transmission change rate of 30% or less calculated by the following equation.

Water vapor transmission change rate (%)= $\{(B-A)/A\} \times 100$     <Equation>

In the Equation above, A can be a water vapor transmission rate of the light-diffusive barrier film ($F_1$); B can be another water vapor transmission rate of the light-diffusive barrier film ($F_1$) measured after applying a constant load on the surface of the barrier layer of the light-diffusive barrier film ($F_1$) so that the light-diffusing layer irregularity surface of another light-diffusive barrier film ($F_2$) meets each other (or contacts each other), to stack the two film and holding the constant load for 24 hours; the light-diffusive barrier films ($F_1$, $F_2$) can have the same configuration; and the water vapor transmission rates (A, B) can be measured using AQUATRAN 2 (MOCON) under conditions of 38° C. and 100% relative humidity.

The light-diffusive barrier films ($F_1$, $F_2$) used in the calculation of the water vapor transmission change rate are each the light-diffusive barrier film according to the present application, each of which comprises a light-diffusing layer, a base layer and a barrier layer sequentially and has characteristics of the respective layers defined in the present application.

In one example, the constant load applied upon the calculation of the water vapor transmission change rate can be made before curing of a polysilazane layer in the film ($F_2$). After the constant load is applied, the polysilazane layer of the film ($F_2$) can be cured. In one example, the water vapor transmission rates A and B can be the water vapor transmission rates of the films ($F_1$, $F_2$) measured before curing of the polysilazane layer. Alternatively, the water vapor transmission rates A and B can be the water vapor transmission rates of the films ($F_1$, $F_2$) measured after curing of the polysilazane layer.

In one example, the change rate can be 25% or less, 20% or less, 15% or less, 10% or less, or 5% or less.

For the above-mentioned reasons, when the roll-to-roll process is performed, the damage to the barrier layer can occur, and thus the barrier property of the damaged film can be deteriorated. That is, the water vapor transmission rate can be increased. Accordingly, with respect to the equation above, the fact that the water vapor transmission change rate (%) is 30% or less can mean that the water vapor transmission increase rate (%) is 30% or less. That is, in the present application, the water vapor transmission change rate (%) can be used in the same meaning as the water vapor transmission increase rate (%). However, it is indicated by the change rate in consideration of the mechanical error related to the measurement of the water vapor transmission change rate.

The water vapor transmission change rate is a numerical change assuming that in the process that the light-diffusive barrier film is produced by using a roll-to-roll process, the film or a part of the film is unwound from and wound on a roller. Specifically, the water vapor transmission rate B is a value for confirming how the water vapor transmission rate of the barrier film has changed (lowered) when the film or a part thereof has been wound on a roll (or roller) while the tension is applied and unwound from the roll (or roller) after the wound state is maintained for a predetermined time. As confirmed from the following experimental examples, the decrease degree of the water vapor transmission rate (that is, the damage degree of the barrier film) can vary depending on, for example, the irregularity degree or sheet resistance of the light-diffusing layer.

Although not particularly limited, a constant load or a predetermined pressure applied to stack two films ($F_1$, $F_2$) upon measuring the water vapor transmission rate B can be about 10 to 35 kg load. In addition, two films ($F_1$, $F_2$) can be cut into a sheet shape upon measuring the water vapor transmission rate B, where the size of the surface that the sheet contacts can be a size of 10 cm×10 cm.

The kind of the base layer is not particularly limited. For example, the base layer can comprise a glass base material or a plastic (polymer) material.

In one example, the base layer can comprise a polyester film such as a polyethylene terephthalate (PET) film, a polycarbonate film, a polyethylene naphthalate film or a polyarylate film, a polyether film such as a polyethersulfone film, a polyolefin film such as a cycloolefin polymer film, a polyethylene film or a polypropylene film, a cellulose resin film such as a diacetyl cellulose film, a triacetyl cellulose film or an acetyl cellulose butyrate film, a polyimide film, an acrylic film, or an epoxy resin film and the like. However, it is not limited thereto.

The base layer can comprise one or more of the listed films. That is, the base layer can be a single layer or a multilayer structure.

The thickness of the base layer is not particularly limited. For example, it can be selected in a range of 2 to 200 μm, in a range of 5 to 190 μm, in a range of 10 to 180 μm, in a range of 20 to 180 μm, or in a range of 20 to 150 μm.

The thickness of the base layer can be measured through observation of a cross-sectional image by, for example, SEM (HR-SEM, S-4800, Hitachi) or TEM (FE-TSEM, TITAN G2 ChemiSTEM 80-200, FEI). Alternatively, the thickness can also be measured by a method of analyzing an electron density difference between adjacent layers by using XRR (X'Petr Pro MRD XRD, PANalytical) and analogizing any thickness oscillation. At this time, the thickness can be an average value of thickness values measured at various points on the surface of the base layer for the thickness to be measured when viewed in the direction normal to the surface thereof.

In one example, the base layer can have transparency or light transmission characteristics. In the present application, the "transparency or light transmission characteristics" can mean a case where a predetermined layer or film has visible light transmittance within a wavelength range of 380 to 780 nm, specifically, transmittance for light with a wavelength of 550 nm of 50% or more, 60% or more, 70% or more, 80% or more, 90% or more, or 95% or more. The upper limit of the transmittance can be, for example, about 100%.

The base layer can comprise one or more additives selected from the group consisting of known additives, for example, an antistatic agent, a ray blocking agent, an ultraviolet absorber, a plasticizer, a lubricant, a filler, a colorant, a stabilizer, a lubricant, a crosslinking agent and an antioxidant.

In one example, a surface treatment such as a primer treatment, corona discharge irradiation, plasma irradiation or ion irradiation can be performed on one or both sides of the base layer, if necessary. For example, the base layer can be a layer that has been subjected to a primer treatment on at least one side in order to improve adhesiveness or adhesion with the light-diffusing layer or the barrier layer.

In one example, the barrier layer can comprise one or more sub-barrier layers. If two or more sub-barrier layers are laminated to form a barrier layer, the types of the sub-barrier layers can be the same or different. For example, as shown in FIG. 2, the light-diffusive barrier film can sequentially comprise a light-diffusing layer, a base layer, a first barrier layer, and a second barrier layer.

In one example, the barrier layer or sub-barrier layer can be a polysilazane layer or a cured layer of polysilazane.

In the present application, the polysilazane layer can be, as a state before curing, for example, a layer formed by coating a polysilazane-containing composition (coating composition) to be described below on one side of a base layer and drying it. In addition, the cured layer of polysilazane can mean a layer formed by curing the polysilazane layer.

The polysilazane layer means a layer (a coating layer in a state before curing formed on a base layer) comprising polysilazane as a main component. The main component can mean, for example, a case where in the polysilazane layer or the polysilazane-containing composition, the ratio of polysilazane is 55% or more, 60% or more, 65% or more, 70% or more, 75% or more, 80% or more, 85% or more, or 90% or more, on the basis of weight. The weight ratio can be, for example, 100% or less, 99% or less, 98% or less, 97% or less, 96% or less, or 95% or less.

In the present application, the term "polysilazane" means a polymer in which silicon atoms (Si) and nitrogen atoms (N) are repeated to form a basic backbone. This polysilazane can be modified through predetermined treatment (for example, plasma treatment to be described below) to form silicon oxide and/or silicon oxynitride having barrier properties. Accordingly, the cured product, that is, the cured layer of the polysilazane layer contains Si, N and/or O, and has barrier properties against external environment.

In one example, the polysilazane used in the present application can comprise a unit of Formula 1:

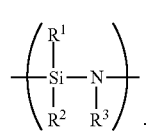

Formula 1

In Formula 1, $R^1$, $R^2$ and $R^3$ can each independently be hydrogen, an alkyl group, an alkenyl group, an alkynyl group, an aryl group, an alkylsilyl group, an alkylamide group or an alkoxy group.

In the present application, the term "alkyl group" means an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group can be linear, branched or cyclic. In addition, the alkyl group can be optionally substituted with one or more substituents.

In the present application, the term "alkenyl group" means an alkenyl group having 2 to 20 carbon atoms, 2 to 16 carbon atoms, 2 to 12 carbon atoms, 2 to 8 carbon atoms, or 2 to 4 carbon atoms, unless otherwise specified. The alkenyl group can be linear, branched or cyclic and can optionally be substituted with one or more substituents.

In the present application, the term "alkynyl group" means an alkynyl group having 2 to 20 carbon atoms, 2 to 16 carbon atoms, 2 to 12 carbon atoms, 2 to 8 carbon atoms, or 2 to 4 carbon atoms, unless otherwise specified. The alkynyl group can be linear, branched or cyclic and can optionally be substituted with one or more substituents.

The term "aryl group" herein means a monovalent residue derived from a compound comprising a structure in which a benzene ring or two or more benzene rings are linked, or condensed or bonded while sharing one or two or more carbon atoms, or a derivate thereof, unless otherwise specified. In this specification, the range of the aryl group can also include a so-called aralkyl group or an arylalkyl group, and the like as well as a functional group usually referred to as an aryl group. The aryl group can be, for example, an aryl group having 6 to 25 carbon atoms, 6 to 21 carbon atoms, 6 to 18 carbon atoms, or 6 to 12 carbon atoms. As the aryl group, a phenyl group, a dichlorophenyl group, a chlorophenyl group, a phenylethyl group, a phenylpropyl group, a benzyl group, a tolyl group, a xylyl group or a naphthyl group, and the like can be exemplified.

In the present application, the term "alkoxy group" means an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group can be linear, branched or cyclic. In addition, the alkoxy group can be optionally substituted with one or more substituents.

The specific type of polysilazane is not particularly limited as long as it includes the unit of Formula 1 above.

In one example, considering denseness of the modified polysilazane layer and the like, as the polysilazane of the present application, polysilazane containing the unit of Formula 1 in which all of $R^1$ to $R^3$ are hydrogen atoms, for example, perhydropolysilazane can be used.

Although not particularly limited, the number average molecular weight (Mn) of the polysilazane compound can be, for example, 100 to 50,000 g/mol or less.

In one example, the polysilazane layer can be formed, for example, by a method of coating a composition (a coating liquid comprising polysilazane as a main component) prepared by dissolving polysilazane in a suitable organic solvent onto a base layer. The type of the solvent contained in the coating liquid is not particularly limited as long as it is a solvent that has no reactivity with polysilazane and simultaneously is capable of dissolving it. For example, hydrocarbon solvents such as aliphatic hydrocarbons, alicyclic hydrocarbons and aromatic hydrocarbons, halogenated hydrocarbon solvents, ethers such as aliphatic ethers and alicyclic ethers can be used. Specifically, hydrocarbons such as pentane, hexane, cyclohexane, toluene, xylene, Solvesso and carbene, halogen hydrocarbons such as methylene chloride and trichloroethane, ethers such as dibutyl ether, dioxane and tetrahydrofuran and the like can be used as a solvent.

In one example, a commercialized polysilazane or a composition comprising the same can be used to form the barrier layer. For example, a polysilazane commercialized product such as AQUAMICA (registered trademark) NN120-10, NN120-20, NAX120-10, NAX120-20, NN110, NN310, NN320, NL110A, NL120A, NL150A, NP110, NP140, or SP140 manufactured by AZ Electronic Materials Kabushiki Kaisha can be used, without being limited thereto.

The polysilazane layer can comprise a polysilazane modification promoting catalyst, that is, a compound that promotes modification of the polysilazane compound by an interaction with the polysilazane compound. Such a catalyst includes an organic amine compound, an organic acid, an inorganic acid, a carboxylic acid metal salt, an organic metal complex salt, or the like, but is not limited thereto.

The barrier layer forming composition can comprise other additives as required. The additive includes a viscosity adjuster or a crosslinking accelerator, and the like, but is not limited thereto.

When the thickness of the polysilazane layer, that is, the sub-barrier layer, coated on the base layer is too thin, the coating process is not smooth, it is difficult to sufficiently secure the barrier properties, and there is a high possibility that the polysilazane layer is damaged by the light-diffusing layer irregularities. Then, when the thickness is too large, cracks (damage) can occur due to shrinkage of the polysilazane layer during the curing process. The thickness of the polysilazane layer to be coated is not particularly limited, but considering the above points, the lower limit can be, for example, about 20 nm or more, 30 nm or more, 40 nm or more, 50 nm or more, 60 nm or more, 70 nm or more, 80 nm or more, 90 nm or more, or 100 nm or more. The upper limit can be, for example, 400 nm or less, 350 nm or less, 300 nm or less, 250 nm or less, or 200 nm or less. At this time, the thickness of the barrier layer means an average thickness coated with a resin component (e.g., polysilazane) forming the barrier layer or a thickness of the cured resin component.

The thickness of the barrier layer can be measured through observation of a cross-sectional image by a known method, for example, SEM (HR-SEM, S-4800, Hitachi) or TEM (FE-TSEM, TITAN G2 ChemiSTEM 80-200, FEI). Alternatively, the thickness can be measured by a method of analyzing an electron density difference between adjacent layers by using XRR (X'Petr Pro MRD XRD, PANalytical) and analogizing any thickness oscillation. At this time, the thickness can be an average value of thickness values measured at various points of the surface formed by the resin component when viewed in the direction normal to the surface of the layer for the thickness to be measured.

In one example, the polysilazane layer can be dried after application on one side of the base layer, and can also be present on the base layer in a state before curing.

In one example, the polysilazane layer can be cured on the base layer.

In one example, the thickness of the layer obtained by curing the polysilazane layer, that is, the cured layer of polysilazane can be determined according to the thickness of the polysilazane layer as described above. Then, the thickness of the barrier layer comprising two or more sub-barrier layers can be appropriately adjusted in accordance with the number of the polysilazane cured layer or the polysilazane layer within a range of 1,500 nm or less.

In one example, the barrier layer can be a laminate of a first sub-barrier layer and a second sub-barrier layer. In this case, the thickness of each sub-barrier layer can be, for example, 40 nm or more, 50 nm or more, 60 nm or more, 70 nm or more, 80 nm or more, 90 nm or more, or 100 nm or more. The upper limit of the thickness of each sub-barrier layer can be, for example, 250 nm or less, 240 nm or less, 230 nm or less, 220 nm or less, 210 nm or less, or 200 nm or less.

When a number of sub-barrier layers are laminated, for example, when the second sub-barrier layer is formed on the first sub-barrier layer, the respective sub-barrier layers can be distinguished, as the cross section of the barrier layer is observed by SEM or TEM.

In one example, the barrier layer can comprise only a polysilazane layer or a cured layer thereof. For example, the metal component-containing layer formed by vapor deposition may not be included.

In one example, the barrier layer can comprise a particle component. The particle component is the same as that described in the light-diffusing layer.

In one example, the barrier layer may not contain a particle component.

In one example, the barrier layer can have transparency or light transmission characteristics.

In one example, the barrier layer can be formed directly on one side of the base layer. That is, there is no separate adhesive layer between them. Accordingly, it is possible to provide a film, which is also thin, having excellent barrier properties.

In one example, the light-diffusing layer having the surface roughness can comprise a matrix component that forms a continuous phase in the light-diffusing layer and a light-diffusing agent that is a dispersed phase present in the continuous phase. At this time, the matrix component can be a curable resin (or a cured product thereof), and the light-diffusing agent can be (light-diffusing) particles known to be capable of performing a light diffusion function. Through the particles, the surface irregularities can be formed and the inherent light diffusion function can be performed.

In one example, the light-diffusing layer having the surface roughness (Rt) can have a thickness of 20 µm or less. Specifically, the upper limit of the thickness of the light-diffusing layer can be 19 µm or less, 18 µm or less, 17 µm or less, 16 µm or less, 15 µm or less, 14 µm or less, 13 µm or less, 12 µm or less, 11 µm or less, 10 µm or less, 9 µm or less, 8 µm or less, 7 µm or less, 6 µm or less, 5 µm or less, 4 µm or less, 3 µm or less, 2 µm or less, or 1 µm or less. In addition, the lower limit of the thickness can be, for example, 0.5 µm or more, 1 µm or more, 2 µm or more, 3 µm or more, 4 µm or more, 5 µm or more, 6 µm or more, 7 µm or more, 8 µm or more, 9 µm or more, or 10 µm or more. When the above range is satisfied, the light-diffusing layer can be stably formed with the above-described surface roughness (Rt).

The thickness of the light-diffusing layer considers only the matrix component, that is, the resin component without considering the light-diffusing particles, which can be measured through observation of a cross-sectional image by a known method, for example, SEM (HR-SEM, S-4800, Hitachi) or TEM (FE-TSEM, TITAN G2 ChemiSTEM 80-200, FEI). Alternatively, the thickness can be measured by a method of analyzing an electron density difference between adjacent layers by using XRR (X'Petr Pro MRD XRD, PANalytical) and analogizing any thickness oscillation. At this time, the thickness can be an average value of thickness values measured at various points of the surface formed by the resin component when viewed in the direction normal to the surface of the layer for the thickness to be measured.

In one example, the light-diffusing layer can be formed from a coating composition (hereinafter, referred to as a 'light-diffusing layer coating composition') comprising 0.1 parts by weight or more of particles relative to 100 parts by weight of the curable resin. Specifically, the lower limit of the content of the particles can be, for example, 0.2 parts by weight or more, 0.3 parts by weight or more, 0.4 parts by weight or more, or 0.5 parts by weight or more, specifically, can be 1 part by weight or more, 2 parts by weight or more, 3 parts by weight or more, 4 parts by weight or more, or 5 parts by weight or more, and specifically, can be 10 parts by weight or more, 15 parts by weight or more, 20 parts by weight or more, 25 parts by weight or more, 30 parts by weight or more, 35 parts by weight or more, 40 parts by weight or more, 45 parts by weight or more, or 50 parts by weight or more. In addition, the upper limit of the content of the particles can be, for example, 100 parts by weight or less, 95 parts by weight or less, 90 parts by weight or less, 85 parts by weight or less, or 80 parts by weight or less.

In one example, for forming a surface with irregularities, that is, a light-diffusing layer surface with a predetermined range of surface roughness (Rt), low density particles can be used upon preparing a light-diffusing layer coating composition. Specifically, when mixing resins, solvents and particles to prepare a light-diffusing layer coating composition, particles having a relatively low density are used, whereby the particles can be protruded to the surface of the light light-diffusing layer coating composition applied on the base layer by buoyancy.

In another example, a method of controlling a diameter of particles in consideration of the thickness of the light-diffusing layer to be formed can be used. Particularly, particles having a larger diameter than the thickness (height) of the light-diffusing layer formed after curing can be used for the light-diffusing layer coating composition. When such a particle diameter is satisfied, the irregularity structure can be formed more easily. For example, when the height of the light-diffusing layer is about 20 μm, particles having a diameter of about 20 to 25 μm can be used. However, when the diameter of the particles is larger than the thickness of the layer, the interface between the particles and the light-diffusing layer can act as a defect, and thus the used amount of particles needs to be appropriately adjusted so that the content thereof is not excessive.

In another example, another method of forming the surface roughness is to use components having different degrees of hydrophobicity or hydrophilicity upon producing the light-diffusing layer coating composition. Specifically, when particles having a smaller diameter than the thickness of the light-diffusing layer are used, relatively more hydrophobic particles or more hydrophilic particles can be used, as compared with the solvent or resin component used in the light-diffusing layer coating composition. If the hydrophobic or hydrophilic characteristics are different from each other as described above, the particles can exist in a floating state on the surface of the light-diffusing layer (or the light-diffusing layer coating composition layer applied on the base layer) formed after the resin curing (or the curing can be performed while maintaining the above state). It can be determined depending on the characteristics (e.g., components) of the particles themselves whether the particles are hydrophobic or hydrophilic. Alternatively, it can be performed through the surface treatment with hydrophobic functional groups or hydrophilic functional groups whether hydrophobicity or hydrophilicity is imparted to the particles. At this time, the hydrophobicity or hydrophilicity is not uniformly determined, which can be determined from the relationship with other components (for example, solvent or resin) used together in the composition and can be relatively determined by generally considering polarity of compounds or functional groups forming the particle surface, or the length of the carbon chain in the compound, and the like. For example, when the thickness of the light-diffusing layer is in a level of 15 to 17 μm, the diameter of particles can be controlled in a range of about 1 to 5 μm, and it is possible to make the particles exist in a floating state on the surface ($S_1$) of the light-diffusing layer by controlling the particle surface characteristics.

The resin component used for forming the light-diffusing layer is not particularly limited. As the resin component, a thermosetting resin, a photo-curable resin, or the like can be used.

In one example, the light-diffusing layer coating composition can comprise an acrylic resin, a urethane resin, a melamine resin, an alkyd resin, an epoxy resin, a siloxane polymer, or condensation products of the following organic silane compounds, and the like.

Although not particularly limited, an acrylic resin can be used in consideration of weatherability, scratch resistance, surface gloss characteristics, and heat resistance.

Specifically, the acrylic resin can be obtained by copolymerizing monomers containing acrylic acid and methacrylic acid derivatives as a main component. The usable monomer includes (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, lauryl (meth)acrylate and tetradecyl (meth)acrylate, and the like, but is not limited thereto.

In one example, the light-diffusing layer composition can comprise a polyfunctional (meth)acrylate as a resin component. As the kind of the polyfunctional acrylate, for example, bifunctional acrylates such as 1,4-butanediol di(meth)acrylate, 1,6-hexanediol di(meth)acrylate, neopentyl glycol di(meth)acrylate, polyethylene glycol di(meth)acrylate, neopentylglycol adipate di(meth)acrylate, hydroxypivalic acid neopentyl glycol di(meth)acrylate, dicyclopentanyl di(meth)acrylate, caprolactone modified dicyclopentenyl di(meth)acrylate, ethylene oxide modified di(meth)acrylate, di(meth)acryloxyethyl isocyanurate, allylated cyclohexyl di(meth)acrylate, tricyclodecane dimethanol (meth)acrylate, dimethylol dicyclopentane di(meth)acrylate, ethylene oxide modified hexahydrophthalic acid di(meth)acrylate, tricyclodecane dimethanol (meth)acrylate, neopentyl glycol modified trimethylpropane di(meth)acrylate, adamantane di(meth)acrylate or 9,9-bis[4-(2-acryloyloxyethoxy)phenyl] fluorene; trifunctional acrylates such as trimethylolpropane tri(meth)acrylate, dipentaerythritol tri(meth)acrylate, propionic acid modified dipentaerythritol tri(meth)acrylate, pentaerythritol tri(meth)acrylate, propylene oxide modified trimethylolpropane tri(meth)acrylate, trifunctional urethane (meth)acrylate or tris(meth)acryloxyethyl isocyanurate; tetrafunctional acrylates such as diglycerin tetra(meth)acrylate or pentaerythritol tetra(meth)acrylate; pentafunctional acrylates such as propionic acid modified dipentaerythritol penta (meth)acrylate; and hexafunctional acrylates such as dipentaerythritol hexa(meth)acrylate, caprolactone modified dipentaerythritol hexa(meth)acrylate or urethane (meth) acrylate (e.g. a reaction product of an isocyanate monomer and trimethylolpropane tri(meth)acrylate), and the like can be used, without being limited thereto.

As the epoxy-based resin which can be used for forming the light-diffusing layer, one or more selected from the group consisting of an alicyclic epoxy resin and an aromatic epoxy resin can be used.

As the alicyclic epoxy resin, for example, at least one selected from the group consisting of an alicyclic glycidyl ether type epoxy resin and an alicyclic glycidyl ester type epoxy resin can be used. Also, for example, 3,4-epoxycyclohexyl-methyl-3,4-epoxy cyclohexane carboxylate, which is Celloxide 2021P (Daicel Co.), and derivatives thereof can be used, which are stable even at high temperatures, colorless and transparent, and have excellent toughness, adhesion and adhesiveness for lamination.

As the aromatic epoxy resin, for example, at least one aromatic epoxy resin selected from the group consisting of a bisphenol A type epoxy resin, a brominated bisphenol A type epoxy resin, a bisphenol F type epoxy resin, a bisphenol AD type epoxy resin, a fluorene-containing epoxy resin and triglycidyl isocyanurate can also be used.

The kind of a polymerization initiator for allowing the resin to form a matrix of the light-diffusing layer by polymerization is not particularly limited and a known photopolymerization initiator or thermal polymerization initiator, and the like can be used.

In addition, the light-diffusing layer coating composition can further comprise a curing agent. The kind thereof is not particularly limited.

The kind of the particles used for forming the light-diffusing layer is not particularly limited. As the particle component, organic particles, inorganic particles, organic-inorganic hybrid particles, or mixtures thereof can be used without limitation. The shape of the particles is also not particularly limited. For example, the particles can be spherical, ellipsoidal, pyramidal, or amorphous.

In one example, when the spherical particles are used upon forming the light-diffusing layer, the surface of the light-diffusing layer having predetermined surface roughness can have a shape that hemispherical protrusions are irregularly protruded or an irregular embossing shape.

The kind of the inorganic particles usable in the light-diffusing layer is not particularly limited. In one example, inorganic particles selected from clay, talc, alumina, calcium carbonate, zirconia, silica, barium sulfate, titanium dioxide, aluminum hydroxide, glass, mica, white carbon, magnesium oxide, zinc oxide, indium oxide and tin oxide particles can be used. Compared with the organic particle component as described below, the inorganic particle component has better blocking properties against moisture and the like, so that the use of the inorganic particles can be advantageous for improving the blocking property against the external environment of the film.

The kind of the organic particles usable in the light-diffusing layer is not particularly limited. The organic particles comprise a polymer component, which includes, for example, acrylic particles, siloxane particles, polycarbonate particles, styrene particles, and the like, but is not limited thereto.

In one example, the particles used in the light-diffusing layer can be amphipathic particles. The amphipathic particles can be determined according to the relative hydrophilicity and hydrophobicity degree of the solvent or resin used together. The amphipathicity can be realized through surface treatment or the like.

In one example, the size of the particles included in the light-diffusing layer can be 50 nm or more or 100 nm or more. Specifically, the size of the particles can be 150 nm or more, 200 nm or more, 250 nm or more, 300 nm or more, 350 nm or more, 400 nm or more, 450 nm or more, or 500 nm or more. In addition, considering the thickness or surface roughness of the light-diffusing layer, for example, the upper limit of the particle size can be, for example, 25 µm or less, 20 µm or less, 15 µm or less, 10 µm or less, 5 µm or less, or 1 µm or less. In this regard, the "particle size" can be used in the same meaning as "particle diameter," which means the length of the largest dimension among the shapes of the particles. The particle diameter can be analyzed using a known particle size analyzer, for example, a DLS (dynamic light scattering system).

When the particle diameter of the light-diffusing layer is larger than the thickness, the irregularities of the light-diffusing layer can be formed by the particle diameter of the particles. When the particle diameter of the light-diffusing layer is smaller than the thickness, the irregularities of the light-diffusing layer can be formed by a particle or aggregation of a plurality of particles, floating on the surface of the light-diffusing layer.

In one example, it can comprise particles having two or more particle diameters. In this case, the size of the particles can mean an average value, for example, an average particle diameter (D50). The D50 means the particle diameter corresponding to a weight percentage of 50% in the particle size distribution curve.

The light-diffusing layer coating composition can comprise a solvent. As the solvent, for example, toluene, xylene, propylene glycol monoethyl ether, cyclopentanone, dimethylformamide (DMF), dimethyl sulfoxide (DMSO), dibutyl ether, anisole or 1,2,4-trichlorobenzene, and the like can be used, without being limited thereto.

The light-diffusing layer coating composition can further comprise an additive of an antistatic agent, an antimicrobial agent, a heat stabilizer, an antioxidant, a releasing agent, a light stabilizer, a surfactant, a coupling agent, a plasticizer, an admixture, a colorant, a stabilizer, a lubricant, a toning agent, a flame retardant, a weatherproofer, an ultraviolet absorber, an ultraviolet blocker, or a combination thereof. The content of these additives is not particularly limited, but they can be used in a range of 0.01 to 10 parts by weight relative to 100 parts by weight of the resin component.

In one example, the light-diffusing layer can be formed directly on one side of the base layer. That is, no separate adhesive layer exists between the base layer and the light-diffusing layer. Accordingly, it is possible to provide a film, which is thin, having excellent barrier properties.

In one example, the light-diffusing layer can have transparency or light transmission characteristics.

In one example, the light-diffusive barrier film can further comprise a hard coating layer. The hard coating layer is a layer that provides hardness or strength to the film. Specifically, as in FIG. 3, the light-diffusive barrier film can include a light-diffusing layer, a base layer, a hard coating layer and a barrier layer sequentially.

In one example, the hard coating layer can directly contact the base layer and the barrier layer, respectively. In this case, scratch resistance and solvent resistance of the base layer can be improved.

The specific composition of a composition for forming a hard coating layer is not particularly limited.

In one example, the hard coating layer forming composition can comprise a curable resin. In this case, the hard coating layer forming composition can further comprise a polymerization initiator and the like. The kind of the polymerization initiator is not particularly limited, and known thermal polymerization initiators or photopolymerization initiators can be used.

In one example, the curable resin contained in the hard coating layer composition can be a photo-curable resin. For example, a urethane acrylate oligomer, a polyester acrylate and the like can be used, without being limited thereto.

In one example, in addition to the resin component, a (meth)acrylate having a hydroxyl group, such as pentaerythritol acrylate and dipentaerythritol hexaacrylate, can be used to form the hard coating layer.

In one example, the hard coating layer forming composition can further comprise particles. The specific kind of the particles is not particularly limited, but for example, one or more of organic or inorganic particles usable in the light-diffusing layer can be used.

In one example, the hard coating layer forming composition can further comprise a solvent. A known solvent can be used without limitation, and for example, the above-described solvent can be used.

In addition, the hard coating layer forming composition can further comprise a curing agent. The kind thereof is not particularly limited.

In one example, the hard coating layer can have the same composition as described above with respect to the light-diffusing layer. For example, the hard coating layer composition can comprise the same resin component as in the light-diffusing layer composition. At this time, the composition for forming a hard coating layer may not comprise particles.

In one example, the hard coating layer can have transparency or light transmission characteristics.

In one example, the light-diffusive barrier film having the above configuration can have a water vapor transmission rate of $5.0 \times 10^{-3}$ g/m$^2$ day or less. For example, the water vapor transmission rate can be $4.5 \times 10^{-3}$ g/m$^2$ day or less, $4.0 \times 10^{-3}$ g/m$^2$ day or less, $3.5 \times 10^{-3}$ g/m$^2$ day or less, $3.0 \times 10^{-3}$ g/m$^2$ day or less, $2.5 \times 10^{-3}$ g/m$^2$ day or less, $2.0 \times 10^{-3}$ g/m$^2$ day or less, $1.5 \times 10^{-3}$ g/m$^2$ day or less, or $1.0 \times 10^{-3}$ g/m$^2$ day or less. The lower limit of the water vapor transmission rate can be, for example, $0.001 \times 10^{-3}$ g/m$^2$ day or more, $0.01 \times 10^{-3}$ g/m$^2$ day or more, or $0.1 \times 10^{-3}$ g/m$^2$ day or more.

In one example, the light-diffusive barrier film having the above configuration can have transparency or light transmission characteristics.

In one example, the light-diffusive barrier film having the above configuration can have a haze of 60% or more, 80% or more, 85% or more, or 88% or more. The haze can be a percentage of the transmittance of the diffused light to the transmittance of the total transmitted light passing through the object to be measured.

The light-diffusive barrier film of the present application can be used as a barrier film or a sealing film in various applications such as various packaging materials, a display such as an LCD (liquid crystal display), a member for a solar cell, a substrate for an electronic paper or an OLED (organic light emitting diode).

In another example of the present application, the present application relates to an electric or electronic device. The electronic or electric device can be, for example, an optical device such as various display devices or lighting devices.

When used in the above application, the light-diffusive barrier film can be positioned such that the barrier layer is adjacent to the object to be protected, i.e., a moisture-susceptible configuration. For example, when the barrier film is attached to an OLED element, the order of lamination can be a light-diffusing layer, a base layer, a barrier layer and an OLED element.

In another example of the present application, the present application relates to a method for producing a light-diffusive barrier film.

The barrier film can be produced through a roll-to-roll process. At this time, a process that the film or laminate is wound on a roll (or roller) of roll-to-roll equipment and/or unwound therefrom can be repeated.

The above method can be performed in such a manner that the laminate of the base layer and the light-diffusing layer is formed first, and then the barrier layer is formed. This is because, in the case of the base layer, it does not have the irregularities and/or sheet resistance of the above-described light-diffusing layer, so that the barrier layer can be damaged in the procedure of using the roll-to-roll process.

The characteristics of the respective light-diffusing layer, base layer and barrier layer, or the materials constituting them, and the like are as described above.

In one example, the method can comprise a first step of providing a laminate comprising a base layer and a light-diffusing layer, wherein a first side ($S_1$) opposite to a second side of the light-diffusing layer facing the base layer has surface roughness (Rt) in a range of 0.1 to 6 μm; and a second step of applying a barrier layer coating composition on the first side opposite to the second side of the base layer, on which the light-diffusing layer is formed, and then drying it to form a barrier layer. At this time, the barrier layer can be a polysilazane layer.

In one example, the method can comprise a first step of providing a laminate comprising a base layer and a light-diffusing layer, wherein a first side ($S_1$) opposite to a second side of the light-diffusing layer facing the base layer has surface roughness (Rt) of 0.02 μm or more to less than 0.1 μm and the first side ($S_1$) of the light-diffusing layer with the surface roughness has a sheet resistance of $10^{10}$ Ω/sq or less; and a second step of applying a barrier layer coating composition on the first side opposite to the second side of the base layer, on which the light-diffusing layer is formed, and then drying it to form a barrier layer. At this time, the barrier layer can be a polysilazane layer.

In one example, the light-diffusing layer can be formed on the first side of the base layer by wet coating. That is, it can be formed by a method of applying the above-described light-diffusing layer coating composition on the first side of the base layer, followed by drying and/or curing.

The method of applying the light-diffusing layer coating composition is not particularly limited. For example, a gravure coating method, a kiss coating method, a die coating method, a lip coating method, a comma coating method, a blade coating method, a roll-to-roll coating method, a knife coating method, a spray coating method, a bar coating method, a spin coating method or a dip coating method, and the like can be used, without being limited thereto.

The drying method for the light-diffusing layer coating composition is also not particularly limited. For example, hot air drying, infrared drying and microwave drying, and the like can be used.

The temperature upon drying can be adjusted in consideration of the boiling point of the liquid (e.g., solvent) component contained in the composition and the durability of the base layer, and the like. In one example, the temperature at which drying is performed can be 50° C. or higher, 60° C. or higher, or 70° C. or higher, and more specifically, 80° C. or higher, 85° C. or higher, 90° C. or higher, 95° C. or higher, or 100° C. or higher. Then, the upper limit can be, for example, 150° C. or lower, 140° C. or lower, 130° C. or lower, 120° C. or lower, 110° C. or lower, or 100° C. or lower.

The drying time is not particularly limited, which can be in a range of several seconds to several tens of minutes, or in a range of several minutes. Although not particularly limited, for example, the drying can be performed for a time of 1 minute or longer to a time of 10 minutes or shorter, 5 minutes or shorter, or 3 minutes or shorter.

The method of curing the light-diffusing layer coating composition is not particularly limited. For example, a method such as ultraviolet (UV) irradiation can be used. The wavelength or energy amount of ultraviolet rays can be appropriately selected by those skilled in the art in consideration of materials to be used and the like, which is not particularly limited.

If the laminate, in which the light-diffusing layer is formed on one side of the base layer, is provided in the above manner, the roll-to-roll process can be used. The roll-to-roll process is a continuous process that a process object is transferred with a plurality of rolls and the bonding or coating, and the like is performed. In the relevant process, the process object can have a thin sheet shape and can be subjected to a process of being wound on a roll (or roller) or unwound therefrom.

Hereinafter, reference numerals R1, R2 and R3, and the like used for describing winding and unwinding are for convenience of description, and they can be the same or different rolls.

In one example, the method can further comprise a step of winding the laminate provided in the first step onto a roll (R1) before performing the second step. Since the wound laminate comprises the light-diffusing layer with the irregularities, the static electricity can be suppressed at the time of peeling the interface between the base layer and the light-diffusing layer off, even if the wound laminate is unwound. Also, damage to the base layer can be minimized even in the wound state where the tension is applied through the surface roughness in the above range.

In one example, the state where the laminate provided in the first step is wound on the roll (R1) can be maintained for a predetermined time. In the case of a roll-to-roll process designed to enable mass production, the laminate can maintain the wound state for several minutes, several tens of minutes, several hours or several days because of necessity of continuous mass production of the laminate and the like. The time for which the wound state is maintained is not particularly limited, which can be, for example, 5 minutes or more, 10 minutes or more, 30 minutes or more, or 1 hour or more, and specifically, can be 5 hours or more, 10 hours or more, 20 hours or more, 24 hours or more, or 48 hours or more.

In one example, the method can perform the second step by unwinding the wound laminate from the roll (R1). That is, a process of coating the barrier layer coating composition on a first side opposite to a second side of the base layer, on which the light-diffusing layer is formed, in the laminate, and then drying it, is performed while transferring the unwound laminate.

The drying with respect to the barrier layer coating composition can be the same as described above in the drying for forming the light-diffusing layer.

In one example, the method can further comprise a step of winding the light-diffusive barrier film provided in the second step on a roll (R2) and holding the wound state for a predetermined time. In the case of a roll-to-roll process designed to enable mass production, it is possible to maintain the wound state on the roll for several minutes, several tens of minutes, several hours or several days because of necessity of continuous mass production of the barrier film or its constituent components, and the like. The time for which the wound state is maintained is not particularly limited, which can be, for example, 5 minutes or more, 10 minutes or more, 30 minutes or more, or 1 hour or more, and specifically, can be 5 hours or more, 10 hours or more, 20 hours or more, 24 hours or more, or 48 hours or more. After winding, a process for curing the dried barrier layer (coating composition) is performed.

In one example, the method can further comprise a step of unwinding the wound light-diffusive barrier film from the roll (R2) and curing the polysilazane layer. Through the curing, compactness of the barrier layer can be ensured, and better barrier properties can be realized.

The curing for the barrier layer can be performed by light irradiation (for example, UV light irradiation) or plasma treatment, and the like. The ultraviolet irradiation can be performed in the same manner as described above.

In one example, the curing for the barrier layer, that is, the curing for the polysilazane layer, can be performed by plasma treatment.

The plasma treatment is performed by generating plasma under an atmosphere containing a plasma generation gas such as Ar and injecting positive ions in the plasma to the polysilazane layer, where the plasma can be generated, for example, by an external electric field or a negative high voltage pulse. This plasma treatment can be performed using a known apparatus.

The plasma treatment for forming the cured layer can be performed while injecting a discharge gas (Ar) and oxygen in a predetermined processing space. More specifically, the plasma treatment can be performed under the following conditions.

In one example, the plasma treatment can be performed under a predetermined power density. Specifically, the power density per unit area of the electrode upon the plasma treatment can be about 0.05 W/cm$^2$ or 0.10 W/cm$^2$ or more. In another example, the power density can be about 0.2 W/cm$^2$ or more, about 0.3 W/cm$^2$ or more, about 0.4 W/cm$^2$ or more, about 0.5 W/cm$^2$ or more, about 0.6 W/cm$^2$ or more, about 0.7 W/cm$^2$ or more, 0.8 W/cm$^2$ or more, or about 0.9 W/cm$^2$ or more. Within the range that satisfies the power density, in the case of the positive electrode, the higher the power density, the degree of plasma treatment can be increased for a short time and the degree of modification of the polysilazane due to application of a high voltage can be increased. In the case of the negative electrode, the excessively high power density can cause damage to the base layer due to a high voltage, and thus considering this point, the upper limit of the power density can be about 2 W/cm$^2$ or less, 1.5 W/cm$^2$ or less, or 1.0 W/cm$^2$ or less.

In one example, in the case of having the power density, the processing energy upon the plasma treatment, which is determined by multiplying the power density by the processing time, can be 50 J/cm$^2$ or less. Specifically, the energy can be 45 J/cm$^2$ or less, 40 J/cm$^2$ or less, 35 J/cm$^2$ or less, 30 J/cm$^2$ or less, 25 J/cm$^2$ or less, 20 J/cm$^2$ or less, and the lower limit can be 5 J/cm$^2$ or more, 10 J/cm$^2$ or more, or 15 J/cm$^2$ or more.

In one example, the plasma treatment can be performed under a predetermined process pressure. Specifically, the process pressure upon the plasma treatment can be 350 mTorr or less. In the case of the positive electrode, the lower the process pressure, the easier the average free path is secured, and thus the plasma treatment can be performed without energy loss due to collision with gas molecules. For example, the process pressure can be 340 mTorr or less, 330 mTorr or less, 320 mTorr or less, 310 mTorr or less, 300 mTorr or less, 290 mTorr or less, 280 mTorr or less, 270 mTorr or less, 260 mTorr or less, 250 mTorr or less, 240 mTorr or less, 230 mTorr or less, 220 mTorr or less, 210 mTorr or less, or 200 mTorr or less. On the other hand, in the case of the negative electrode, the lower the process pressure is, the less the gas molecules are, and thus high voltage and power can be required to generate the plasma, where the high voltage and the high power can cause damage to the base layer, and for example, the lower limit can be 50 mTorr or more, 60 mTorr or more, 70 mTorr or more, 80 mTorr or more, 90 mTorr or more, 100 mTorr or more, 110 mTorr or more, 120 mTorr or more, 130 mTorr or more, 140 mTorr or more, 150 mTorr or more, 160 mTorr or more, 170 mTorr or more, 180 mTorr or more, or 190 mTorr or more. The pressure can be a pressure at the beginning of the process and the pressure can be maintained within the range during the process.

When the discharge gas (Ar) and oxygen are used as process gases, the vapor pressure of oxygen in the processing space can be in a range of 20 to 80%. The oxygen vapor pressure means the injection flow rate percentage of the injected oxygen relative to the total flow rate of gases injected into the processing space. For example, in the case of performing the plasma treatment while injecting Ar and $O_2$ at flow rates of A sccm and B sccm, respectively, the vapor pressure of oxygen can be calculated as 100×B/(A+B).

The plasma treatment time can be appropriately adjusted at a level that does not hinder the barrier properties of the film. For example, the plasma treatment can be performed for a time of about 10 seconds to 10 minutes or so.

Furthermore, as described above, the light-diffusive barrier film can further comprise a hard coating layer. The coating, drying, and/or drying of the light-diffusing layer coating composition can also be equally applied to formation of the hard coating layer.

In one example, the hard coating layer can be made at the same time as the coating on the light-diffusing layer or at the different times.

In another example, the method can further comprise steps of winding the laminate provided in the first step on a roll (R1') before performing the second step; and providing a second laminate by forming a hard coating layer while unwinding the laminate from the roll (R1'). Hereinafter, the method can be performed in such a manner that through a step of winding the second laminate, on which the hard coating layer is formed, on a roll (R1"), the second step is performed while unwinding the laminate from the roll (R1").

Furthermore, as described above, the light-diffusive barrier film can comprise a plurality of sub-barrier layers. For example, the light-diffusive barrier film can have a structure that a first sub-barrier layer and a second sub-barrier layer are sequentially laminated. At this time, the first sub-barrier layer is located closer to the base layer than the second sub-barrier layer (see FIG. 2 or FIG. 4). In this case, as described above, a step of applying a second sub-barrier layer coating composition on the outer surface of the first sub-barrier layer of the light-diffusive barrier film (F') obtained after curing for the first sub-barrier layer and drying it, and a step of curing the same can be further performed. The formation of the second sub-barrier layer can be performed by a roll-to-roll method. As described above, the barrier film (F') can comprise a light-diffusing layer, a base layer and a first sub-barrier layer sequentially, or can also comprise a light-diffusing layer, a base layer, a hard coating layer and a first sub-barrier layer sequentially.

In one example, the barrier film (F') can be wound onto a roll (R3) before application to the second sub-barrier layer coating composition. Then, the second sub-barrier layer coating composition can be coated on the barrier film (F') unwound from the roll (R3), dried and cured. As a result, a light-diffusive barrier film (F") comprising at least a light-diffusing layer, a base layer, a first sub-barrier layer and a second sub-barrier layer sequentially can be produced. As described above, the barrier film (F") can further comprise a hard coating layer between the base layer and the first sub-barrier layer, and the related processes are as described above.

Advantageous Effects

According to one example of the present application, damage of a barrier film during a roll-to-roll process can be prevented, whereby a light-diffusive barrier film having excellent barrier properties against gas or moisture can be provided. Furthermore, according to one example of the present application, there is an advantage that the film production process is simplified, and the thinning and enlargement of the film are facilitated.

BRIEF DESCRIPTION OF DRAWINGS

FIGS. 1 to 4 schematically show structures of a light-diffusive barrier film according to an embodiment of the present application.

The reference numerals used in the drawings are as follows.

10: barrier layer
11: second sub-barrier layer
12: first sub-barrier layer
20: base layer
30: light-diffusing layer
40: hard coating layer

EXAMPLES

Hereinafter, the present application will be described in detail by way of examples. However, the protection scope of the present application is not limited by the examples as described below.

<Measurement Methods>

For films of Examples and Comparative Examples below, the respective physical properties of Examples and Comparative Examples below as compared were measured as follows.

Method of Measuring Surface Roughness

The surface roughness of the light-diffusing layer surface was measured by a non-contact (vibrating) method using AFM (atomic force microscope) equipment, for example, XE7 equipment from Park Science.

Method of Measuring Sheet Resistance

The produced light-diffusive barrier film was cut to a width of 10 cm and a length of 10 cm to prepare a specimen. Subsequently, using a sheet resistance meter (Hiresta-UP MCP-HT450, Mitsubishi Chemical), the electrode of the meter was pressed at a pressure of 2 kgf, and then the sheet resistance was measured at an applied voltage of 500 V. Three points in the width direction of the specimen were each measured for 10 seconds, and an average value was taken.

Method of Measuring Water Vapor Transmission Rate (1) Water Vapor Transmission Rate ($10^{-3}$ g/m$^2$day)

The water vapor transmission rates of the light-diffusive barrier films finally prepared in Examples and Comparative Examples were measured using AQUATRAN 2 (MOCON) under 38° C. and 100% relative humidity.

(2) Water Vapor Transmission Change Rate (%)

It was calculated according to the following equation.

$$\text{Water vapor transmission change rate } (\%) = \{(B-A)/A\} \times 100 \quad <\text{Equation}>$$

In Equation above, A is the water vapor transmission rate (in Tables 1 and 2, (i) water vapor transmission rate) of the light-diffusive barrier film finally produced without any blocking process (see Step 4) in Example 1 below) in each of Examples and Comparative Examples, and B is the water vapor transmission rate (in Tables 1 and 2, (ii) water vapor transmission rate) of the light-diffusive barrier film finally produced according to each of Examples and Comparative Examples. Each water vapor transmission rate (A, B) is measured using AQUATRAN 2 (MOCON) under conditions of 38° C. and 100% relative humidity.

Method of Measuring Haze and Light Transmittance

The haze and the light transmittance of the produced light-diffusive barrier film were measured using a haze meter (hm-150, Murakami color research laboratory).

EXAMPLES AND COMPARATIVE EXAMPLES

Example 1

1) Formation of Light-Diffusing Layer on Base Layer

A light-diffusing layer coating composition containing 20 parts by weight of a photocurable resin relative to a solvent was prepared. Specifically, 80 parts by weight of pentaerythritol triacrylate (PETA) and 20 parts by weight of dipentaerythritol hexaacrylate (DPHA) were dissolved in a solvent (propylene glycol monomethyl ether). To the solution, 4 parts by weight of a polymerization initiator (Irgacure 127, Ciba), 5 parts by weight of an antistatic agent (ELEC ME-2, Kao) and 10 parts by weight of particles (MX80, Soken) having an average particle diameter of 0.8 μm were added to prepare a light-diffusing layer composition.

It was applied on one side of a polyethylene terephthalate (PET) film (T600E50, Mitsubishi) having a thickness of 50 μm by a bar coat (using #5 bar) method. Thereafter, the obtained coating film was heated and dried at 100° C. for 2 minutes, and then subjected to vacuum UV light irradiation using a UV light irradiation line to form a light-diffusing layer having the surface roughness (Rt) described in the following table.

2) Formation of Hard Coating Layer

With regard to the opposite side of the base film on which the light-diffusing layer was formed, 80 parts by weight of pentaerythritol triacrylate (PETA) and 20 parts by weight of dipentaerythritol hexaacrylate (DPHA) were dissolved in a solvent (propylene glycol monomethyl ether). To the solution, 4 parts by weight of a polymerization initiator (Irgacure 127, Ciba) was added to prepare a hard coating composition. After a coating film was formed on the surface of the base film, on which the light-diffusing layer was not formed, by a bar coat method, it was heated and dried at 100° C. for 2 minutes, and then irradiated with UV rays to form a hard coating layer having a thickness of 1 μm.

3) Formation of Barrier Layer

Polysilazane (trade name: NL120) was dissolved in dibutyl ether, and then the solution was applied to the surface of the hard coating layer, on which the base film was not formed, by a bar coat method. The obtained coating film was heated and dried at 70° C. for 1 minute and at 130° C. for 2 minutes to form a barrier layer having a thickness of 150 nm (uncured barrier layer formation).

4) Performing Blocking

The film having the laminated structure of the 'light-diffusing layer/base layer/hard coating layer/barrier layer' formed through the above-described processes 1) to 3) is referred to as a first film ($F_1$). Also, a second film ($F_2$) was further produced through the same processes as the production of the first film ($F_1$). A load of 18 kg was applied on the surface of the barrier layer of the first film ($F_1$) so that the light-diffusing layer irregularity surface of the second barrier film ($F_2$) met each other to stack the first and second films ($F_1$, $F_2$), and the load was maintained for 24 hours. At this time, the first and second films ($F_1$, $F_2$) are in a sheet shape, where the size of the contact area is 10 cm×10 cm. The relevant process simulates the process when the light-diffusive barrier film has been wound in the roll-to-roll process.

5) Curing of Barrier Layer (First Barrier Layer)

The first film ($F_1$) was subjected to plasma treatment to cure the barrier layer. The plasma treatment was performed under conditions of a flow rate of about Ar:O2=1:1 (on the basis of sccm), a pressure of about 138 mTorr, a power of about 0.27 W/cm$^2$ and an energy of about 20 J/cm$^2$. The barrier layer curing was finally performed to produce a light-diffusive barrier film of Example 1.

Example 2

A light-diffusive barrier film of Example 2 was produced in the same manner as in Example 1, except that another coating bar was used at the time of coating the light-diffusing layer composition (#4 bar using). The surface roughness (Rt) value of the light-diffusing layer is shown in the following table.

Example 3

A light-diffusive barrier film of Example 3 was produced in the same manner as in Example 1, except that no antistatic agent was used and another coating bar was used at the time of coating the light-diffusing layer composition (#3 bar using). The surface roughness (Rt) value of the light-diffusing layer is shown in the following table.

Example 4

A light-diffusive barrier film of Example 4 was produced in the same manner as in Example 1, except that no antistatic agent was used in the light-diffusing layer composition and particles (GB05S, Aica Kogyo) having an average particle diameter of 5 μm were used instead of the particles used in Example 1 (coated with a #5 bar). The surface roughness (Rt) value of the light-diffusing layer is shown in the following table.

Example 5

A light-diffusive barrier film of Example 5 was produced in the same manner as in Example 4, except that another coating bar was used at the time of coating the light-diffusing layer composition (#4 bar using). The surface roughness (Rt) value of the light-diffusing layer is shown in the following table.

Example 6

A light-diffusive barrier film of Example 6 was produced in the same manner as in Example 4, except that another coating bar was used at the time of coating the light-diffusing layer composition (#3 bar using). The surface roughness (Rt) value of the light-diffusing layer is shown in the following table.

Example 7

A light-diffusive barrier film of Example 7 was produced in the same manner as in Example 6, except that in Process 3), the thickness of the heat-dried barrier layer was changed to 80 nm instead of 150 nm. The surface roughness (Rt) value of the light-diffusing layer is shown in the following table.

Example 8

The polysilazane composition was coated on the cured barrier layer (first barrier layer) of the light-diffusive barrier film produced in Example 3 and dried in the same manner as in Process 3) described in Example 1. Thereafter, a light-diffusive barrier film of Example 8 comprising a first barrier layer (cured) and a cured second barrier layer (cured) (thickness 150 nm) was produced through Processes 4) and 5) described in Example 1. The surface roughness (Rt) value of the light-diffusing layer is shown in the following table.

Comparative Example 1

A light-diffusive barrier film of Comparative Example 1 was produced in the same manner as in Example 1, except that particles (MX-2000, Soken) having an average particle diameter of 20 μm were used instead of the particles used in Example 1, a light-diffusing layer coating composition containing 50 parts by weight of the photo-curable resin relative to the solvent was used, no antistatic agent was used and the knife coating was used at the time of coating the light-diffusing layer composition. The surface roughness (Rt) value of the light-diffusing layer is shown in the following table.

Comparative Example 2

A light-diffusive barrier film of Comparative Example 2 was produced in the same manner as in Example 1, except that no antistatic agent was used in the light-diffusing layer composition. The surface roughness (Rt) value of the light-diffusing layer is shown in the following table.

Comparative Example 3

A light-diffusive barrier film of Comparative Example 3 was produced in the same manner as in Example 2, except that no antistatic agent was used in the light-diffusing layer composition. The surface roughness (Rt) value of the light-diffusing layer is shown in the following table.

Comparative Example 4

A light-diffusive barrier film of Comparative Example 4 was produced in the same manner as in Comparative Example 1, except that in Process 3), the thickness of the heat-dried barrier layer was changed to 80 nm instead of 150 nm. The surface roughness (Rt) value of the light-diffusing layer is shown in the following table.

From Table 2 above, it is confirmed that Comparative Example 4 has a high 'water vapor transmission rate (ii)' and a high 'water vapor transmission change rate (%).' Particularly, the water vapor transmission change rate is much higher than that of the examples. This means that when the surface roughness (Rt) of the light-diffusing layer is excessively large, the barrier layer is damaged by the irregularities of the light-diffusing layer in the wound state. That is, the results of Example 7 and Comparative Example 4 suggest that it is important to prevent damage to the barrier layer in the roll-to-roll process even when the thickness of the barrier

TABLE 1

|  | Light-diffusing layer Rt (μm)* | Light-diffusing layer sheet resistance (Ω/sq) | Water vapor transmission rate | | Water vapor transmission change rate (%)** |
|---|---|---|---|---|---|
|  |  |  | (i) upon performing no blocking ($10^{-3}$ g/m² day) | (ii) upon performing blocking ($10^{-3}$ g/m² day) |  |
| Example 1 | 0.025 | $8.3 \times 10^9$ | 3.24 | 3.38 | 4.32 |
| Example 2 | 0.08 | $7.3 \times 10^9$ | 3.31 | 2.95 | 10.9 |
| Example 3 | 0.13 | Not measurable*** | 2.87 | 2.43 | 15.3 |
| Example 4 | 1.34 | Not measurable | 3.16 | 3.56 | 12.7 |
| Example 5 | 3.52 | Not measurable | 3.35 | 3.18 | 5.1 |
| Example 6 | 5.13 | Not measurable | 2.95 | 3.64 | 23.4 |
| C. Exam. 1 | 8.34 | Not measurable | 3.48 | 12 | 244.8 |
| C. Exam. 2 | 0.025 | Not measurable | 3.72 | 14 | 276.3 |
| C. Exam. 3 | 0.08 | Not measurable | 3.25 | 18 | 453.8 |

*R(t) of the light-diffusing layer is influenced by a particle size, a thickness of the coated product and particle aggregation, and the like.
**The water vapor transmission change rate (%) is the percentage change rate between (i) and (ii) values based on the value of (i).
***Not measurable: more than the limit value sheet resistance ($10^{12}$ Ω/sq) of the measuring equipment.
C. Exam.: Comparative Example From Examples 3 to 6, it can be seen that the sheet resistance is large because no antistatic agent is used upon forming the light-diffusing layer. However, from the water vapor transmission change rates, it can be seen that the damage of the barrier layer is small in these examples. This is because the surface roughness of the light-diffusing layer is sufficient, so that damage due to generation of static electricity at the interface peeling can be avoided. In Comparative Example 1, since the surface irregularities are too large, the barrier layer is damaged by the irregularities, so that the water vapor transmission change rate is large.

On the other hand, when Examples 1 and 2 are compared with Comparative Examples 2 and 3, it can be seen that even if the surface roughness of the light-diffusing layer exists, in the case of being 0.1 μm or less, there is a limit to reduce the degree of interface adhesiveness between the light-diffusing layer and the barrier layer, and thus it is necessary to adjust the sheet resistance of the light-diffusing layer to a predetermined range.

layer that has the greatest effect on the water vapor transmission rate of the film is the same.

TABLE 3

|  | Barrier layer | Water vapor transmission rate ($10^{-3}$ g/m² day) | Haze (%) | Light transmittance (%) |
|---|---|---|---|---|
| Example 3 | Single layer | 2.43 | 86.5 | 89.1 |
| Example 8 | Two layers | 0.02 | 86.6 | 86.5 |

Table 3 above shows that the water vapor transmission rate decreases as a number of barrier layers are included (that is, comprising two or more sub-barrier layers) regardless of the presence or absence of blocking. Specifically, even if the second barrier layer is further formed on the first barrier layer after the blocking is performed, it can be confirmed that excellent moisture blocking properties (low

TABLE 2

|  | Light-diffusing layer Rt (μm)* | Light-diffusing layer sheet resistance (Ω/sq) | Water vapor transmission rate | | Water vapor transmission change rate (%)** |
|---|---|---|---|---|---|
|  |  |  | (i) upon performing no blocking ($10^{-3}$ g/m² day) | (ii) upon performing blocking ($10^{-3}$ g/m² day) |  |
| Example 7 | 5.13 | Not measurable | 11.86 | 13.38 | 12.8 |
| C. Exam. 4 | 8.34 | Not measurable | 11.86 | 347.74 | 2,832 |

*R(t) of the light-diffusing layer is influenced by a particle size, a thickness of the coated product and particle aggregation, and the like.
**The water vapor transmission change rate (%) is the percentage change rate between (i) and (ii) values based on the value of (i).
***Not measurable: more than the limit value sheet resistance ($10^{12}$ Ω/sq) of the measuring equipment.
C. Exam.: Comparative Example

The invention claimed is:

1. A light-diffusive barrier film comprising a light-diffusing layer, a base layer and a barrier layer sequentially,
wherein a first side ($S_1$) opposite to a second side of the light-diffusing layer facing the base layer has irregularities with surface roughness (Rt) in a range of 0.1 to 6 μm,
wherein the light-diffusing layer is formed from a coating composition comprising 10 parts by weight or more of particles relative to 100 parts by weight of a curable resin,
wherein the size of the particles is 500 nm or more,
wherein the surface roughness (Rt) means a distance between the highest point (H1) and the lowest point (H2), that is, a height difference (ΔH=H1−H2), when a layer, which is intended to measure the surface roughness, is observed in the direction normal to the surface,
wherein a water vapor transmission change rate calculated by the following equation satisfies 30% or less:

Water vapor transmission change rate (%)={(B−A)/A}×100  <Equation> wherein:
A is a water vapor transmission rate of the light-diffusive barrier film ($F_1$);
B is another water vapor transmission rate of the light-diffusive barrier film ($F_1$) measured after applying a constant load on the surface of the barrier layer of the light-diffusive barrier film ($F_1$) so that the light-diffusing layer irregularity surface of another light-diffusive barrier film ($F_2$) meets each other, to stack the two film and holding the constant load for 24 hours; the light-diffusive barrier films ($F_1$, $F_2$) have the same configuration; and
the water vapor transmission rates (A, B) is measured using AQUATRAN 2 (MOCON) under conditions of 38° C. and 100% relative humidity.

2. A light-diffusive barrier film comprising a light-diffusing layer, a base layer and a barrier layer sequentially,
wherein a first side ($S_1$) opposite to a second side of the light-diffusing layer facing the base layer has surface roughness (Rt) of 0.02 μm or more to less than 0.1 μm, and the first side (S1) of the light-diffusing layer with the surface roughness has a sheet resistance of $10^{10}$ Ω/sq or less,
wherein the light-diffusing layer is formed from a coating composition comprising 0.1 parts by weight or more of particles relative to 100 parts by weight of a curable resin,
wherein the surface roughness (Rt) means a distance between the highest point (H1) and the lowest point (H2), that is, a height difference (ΔH=H1−H2), when a layer, which is intended to measure the surface roughness, is observed in the direction normal to the surface,
wherein a water vapor transmission change rate calculated by the following equation satisfies 30% or less:

Water Vapor Transmission Change Rate (%)={(B−A)/A}×100  <Equation> wherein:
A is a water vapor transmission rate of the light-diffusive barrier film (F1);
B is another water vapor transmission rate of the light-diffusive barrier film (F1) measured after applying a constant load on the surface of the barrier layer of the light-diffusive barrier film (F1) so that the light-diffusing layer irregularity surface of another light-diffusive barrier film (F2) meets each other, to stack the two film and holding the constant load for 24 hours; the light-diffusive barrier films (F1, F2) have the same configuration; and
the water vapor transmission rates (A, B) is measured using AQUATRAN 2 (MOCON) under conditions of 38° C. and 100% relative humidity.

3. The light-diffusive barrier film according to claim 2, wherein the light-diffusing layer comprises an antistatic agent.

4. The light-diffusive barrier film according to claim 1, wherein the barrier layer comprises one or more sub-barrier layers.

5. The light-diffusive barrier film according to claim 4, wherein the sub-barrier layer has a thickness in a range of 20 to 400 nm.

6. The light-diffusive barrier film according to claim 4, wherein the barrier layer or the sub-barrier layer is a polysilazane layer or a cured layer of the polysilazane layer.

7. The light-diffusive barrier film according to claim 6, wherein the polysilazane has a unit of the following Formula 1:

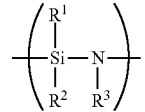

Formula 1 wherein, $R^1$, $R^2$ and $R^3$ are each independently hydrogen, an alkyl group, an alkenyl group, an alkynyl group, an aryl group, an alkylsilyl group, an alkylamide group or an alkoxy group.

8. The light-diffusive barrier film of claim 1, wherein the light-diffusing layer has a thickness of 20 μm or less.

9. The light-diffusive barrier film of claim 1, wherein the light-diffusing layer, the base layer and the barrier layer are in direct contact with each other.

10. An electric or electronic device comprising the light-diffusive barrier film of claim 1.

11. A method for producing a light-diffusive barrier film of claim 1, comprising:
providing a laminate comprising a base layer and a light-diffusing layer, wherein a first side ($S_1$) opposite to a second side of the light-diffusing layer facing the base layer has surface roughness (Rt) in a range of 0.1 to 6 μm; and
applying a barrier layer coating composition on the first side opposite to the second side of the base layer, on which the light-diffusing layer is formed, and then drying it to form a polysilazane layer.

12. A method for producing a light-diffusive barrier film of claim 2, comprising:
providing a laminate comprising a base layer and a light-diffusing layer, wherein a first side ($S_1$) opposite to a second side of the light-diffusing layer facing the base layer has surface roughness (Rt) of 0.02 μm or more and less than 0.1 μm and the first side ($S_1$) of the light-diffusing layer with the surface roughness has a sheet resistance of $10^{10}$ Ω/sq or less; and
applying a barrier layer coating composition on the first side opposite to the second side of the base layer, on which the light-diffusing layer is formed, and then drying it to form a polysilazane layer.

13. The method of claim 11, wherein a light-diffusing layer coating composition comprising 10 parts by weight or more of particles relative to 100 parts by weight of a curable resin is coated on one side of the base layer and then cured to form the light-diffusing layer.

14. The method of claim 11, wherein the barrier layer coating composition comprises a polysilazane of Formula 1:

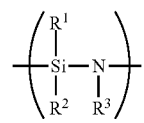

Formula 1 wherein, R1, R2 and R3 are each independently a hydrogen atom, an alkyl group, an alkenyl group, an alkynyl group, an aryl group, an alkylsilyl group, an alkylamide group or an alkoxy group.

15. The method for producing a light-diffusive barrier film according to claim 14, wherein a roll-to-roll process is used, and the method further comprises winding the laminate provided in the first step onto a roll (R1) before applying the barrier layer coating composition.

16. The method of claim 15, wherein the wound laminate is unwound from the roll (R1) for applying the barrier layer coating composition and further comprises winding the light-diffusive barrier film after applying the barrier layer coating composition on a roll (R2) and holding the wound state for 1 hour or longer.

17. The method of claim 16, further comprising unwinding the wound light-diffusive barrier film from the roll (R2) and curing the polysilazane of the barrier layer coating composition and the curing of the polysilazane is performed by plasma treatment or UV light irradiation.

* * * * *